United States Patent [19]

Lynch et al.

[11] Patent Number: 4,646,123
[45] Date of Patent: Feb. 24, 1987

[54] LATCHUP-PREVENTING CMOS DEVICE

[75] Inventors: William T. Lynch, Summit; Louis C. Parrillo, Warren, both of N.J.

[73] Assignee: AT&T Bell Laboratories, Murray Hill, N.J.

[21] Appl. No.: 857,391

[22] Filed: Apr. 21, 1986

Related U.S. Application Data

[63] Continuation of Ser. No. 540,624, Oct. 11, 1983.

[51] Int. Cl.$^4$ .................... H01L 27/02; H01L 29/06
[52] U.S. Cl. ........................................ 357/42; 357/55; 357/59; 357/60; 357/23.8
[58] Field of Search ...................... 357/42, 55, 59, 49, 357/60, 23.8; 29/576 W, 580

[56] References Cited

U.S. PATENT DOCUMENTS 4,231,057 10/1980 Momma et al. ...................... 357/55
4,477,310 10/1984 Dark et al. ............................ 357/59

OTHER PUBLICATIONS

T. Fukushima et al., "A High Speed Schottky 4k–Bit PROM Using Diffused Eutectic Aluminum Process (Deap)," Proceedings of the 11th Conference (1979 International) on Solid State Devices, Tokyo, 1979; *Japanese Journal of Applied Physics*, vol. 19 (1980) Supplement 19-1, pp. 175-180.
S. Y. Chiang et al, "Trench Isolation Technology for MOS Applications," *Journal of the Electrochemical Society*, Aug. 1982, vol. 129, No. 8, p. 327C, Abstract 174 (abstract for the Fall Meeting of the Electrochemical Society held Oct. 17-21, 1982, in Detroit, Michigan).
S. Y. Chiang et al, "Trench Isolation Technology for MOS Applications," *The Electrochemical Society Extended Abstracts*, vol. 82-2, Abstract No. 174 (extended abstract for the Fall Meeting of the Electrochemical Society held Oct. 17-21, 1982, in Detroit, Michigan).
S. Y. Chiang et al, "Trench Isolation Technology for MOS Applications," *Proceedings of the First International Symposium on VLSI Science and Technology*, vol. 82-7, pp. 339-346 (proceedings of the Fall Meeting of the Electrochemical Society held Oct. 17-21, 1982, in Detroit, Michigan).
R. D. Rung et al, "Deep Trench Isolated CMOS Devices," *IEDM Technical Digest*, Dec. 1982, pp. 237-240.

*Primary Examiner*—Martin H. Edlow
*Assistant Examiner*—Terri M. Henn
*Attorney, Agent, or Firm*—Bernard Tiegerman

[57] ABSTRACT

A new CMOS device which avoids latchup while achieving a spacing between the n-channel and p-channel FETs of the device smaller than 10 μm, as well as a method for fabricating the device, is disclosed.

The inventive CMOS device includes a latchup-preventing, polysilicon-filled trench formed in the semiconductor substrate between the n- and p-channel FETs of the device. The polysilicon-filled trench is essentially free of crack-inducing voids, and achieves a width less than 10 μm, because the angle between the trench sidewall and a perpendicular drawn to the substrate surface is greater than, or equal to, about 5 degrees but less than about 10 degrees. Also, a thickness of the polysilicon deposited into the trench is greater than half the width of the trench.

12 Claims, 6 Drawing Figures

LATCHUP-PREVENTING CMOS DEVICE

This is a continuation of application Ser. No. 540,624, filed Oct. 11, 1983.

BACKGROUND OF THE INVENTION

1. Field of the Invention

The invention pertains generally to semiconductor devices and, more particularly, to complementary metal oxide semiconductor devices.

2. Art Background

Complementary metal oxide semiconductor (CMOS) integrated circuit devices include both n- and p-channel field effect transistors (FETs) on the same substrate. Such CMCS devices have come into increasing use because, among other advantageous properties, they consume relatively little power and exhibit relatively high noise immunity.

Despite their advantages, CMOS devices are susceptible to undesirable conduction phenomena. For example, in a typical CMOS device, depicted in FIG. 1, an n-tub (or p-tub) 40 is formed in a p- (or n-) bulk region 30. A p+-type source 70, a p+-type drain 80, and gate 90 constitute a p-channel FET Q1 in the n-tub 40, while an n+-type source 110, an n+-type drain 120, and gate 130 constitute an n-channel FET Q2 in the bulk region 30. (Voltages biases are typically applied to the substrate 20 through low resistance contacts such as the n+-type region 60 in the n-tub 40 and the p+-type region 100 in the p-type bulk region 30.) Inherent in the CMOS device are parasitic bipolar transistors which include a vertical p-n-p transistor T1 (shown schematically in FIG. 1) having two emitters provided by the heavily doped p+-type regions 70 and 80, a base provided by a portion of the n-tub 40, and a collector provided by the p-type bulk region 30; and a horizontal n-p-n transistor T2 (also shown schematically in FIG. 1) having two emitters provided by the heavily doped n+-type regions 110 and 120, a base provided by a portion of the p-type bulk region 30, and a collector provided by the n-tub 40. Under appropriate conditions, the collector current of each parasitic bipolar transistor supplies base current to the other bipolar transistor, in a positve feedback arrangement, to produce an undersirable parasitic interaction denominated latchup. (Regarding latchup see, e.g., S. M. Sze, ed., *VLSI Technology*, McGraw-Hill, New York, 1983, p. 481). This interaction produces either a temporary malfunction of the CMOS device or, in some cases, permanent circuit damage.

A condition which must be satisfied for latchup to occur is that the product of the common emitter DC current gains of transistors T1 and T2 is greater than or equal to one. Attempts to avoid latchup have involved methods for reducing the gain of one or both transistors to achieve a product of the gains less than one.

The latchup-inducing current flowing through the base, to the collector, of a parasitic bipolar transistor is made up of minority carriers in the base. The gain of the transistor, and the possibility of latchup, is reduced by reducing this current. Such a reduction is achieved, for example by increasing the Base Gummel Number (defined as the integral of the doping level within the base over the path length of minority carriers traversing the base) of the transistor. An increase in Base Gummel Number reduces the minority carrier base current because it decreases the base minority carrier density (in this regard see, e.g., S. M. Sze, *Physics of Semiconductor Devices,* Wiley, New York, 1981, 2d edition, chapter 3) and increases the likelihood of recombination between minority and majority carriers.

A method for increasing the Base Gummel Number of, for example, the horizontal parasitic bipolar transistor T2 involves increasing the spacing between the p-channel and n-channel FETs Q1 and Q2 (i.e., increasing the distance between the right side of drain region 80 and the left side of drain region 120, as viewed in FIG. 1). A sufficient increase in Base Gummel Number to significantly reduce the possibility of latchup is only achieved if the spacing between the FETs Q1 and Q2 is about 10 $\mu$m (or greater). However, so great a spacing is undesirable because this results in an undesirably low device packing density, and thus wasted substrate surface area.

Yet another method for preventing latchup involves the introduction of alternate conduction paths to short-circuit those leading to undesirable, latchup-inducing interactions. For example, one such technique, depicted in FIG. 2, involves the use of a substrate 20 which includes a p-type layer 34 (in which the n-tub 40 and the FETs Q1 and Q2 are formed) epitaxially grown on a relatively heavily doped p+-type bulk region 32. Because the p+-type bulk region 32 constitutes a relatively low resistance path, latchup-inducing hole currents are shunted through the layer 34 into the bulk region 32, reducing interactions between the parasitic bipolar transistors T1 and T2. However, this technique is only useful provided the spacing between the p-channel and n-channel FETs Q1 and Q2 is relatively large, typically about 10 $\mu$m. So large a spacing is, again, wasteful of substrate surface area.

Thus, those engaged in the development of CMOS devices have sought, thus far without success, techniques for eliminating, or substantially reducing the possibility of, latchup which avoid wasting substrate surface area, i.e., which permit relatively small spacings, less than about 10 $\mu$m, between the p-channel and n-channel FETs of the device.

SUMMARY OF THE INVENTION

The invention involves a new CMOS device, formed in a silicon substrate, which entirely avoids, or subtantially reduces the possibility of, latchup while achieving a spacing between the n-channel and p-channel FETs of the device smaller than 10 $\mu$m, preferably smaller than about 4 $\mu$m, and even as small as the resolution limit of the lithographic technique used to fabricate the device. The invention also involves a method for fabricating the inventive device.

The inventive CMOS device, unlike prior devices, includes a latchup-preventing trench formed in the silicon substrate between the p-channel and n-channel FETs of the device. Latchup is entirely avoided, or the possibility of its occurrence significantly reduced, even though the width of the trench (and thus the spacing between the p-channel and n-channel FETs) is less than 10 $\mu$m.

To simplify the fabrication difficulties associated with the non-planar surface introduced by the trench, a filler material is deposited into the trench to define a substantially planar surface. However, not all filler materials are useful. For example, the use of polycrystalline or amorphous silicon (hereafter referred to as polysilicon) to fill the trench rather than other materials such as $SiO_2$, has been found to be extremely important to avoid the production of cracks in the CMOS device during high temperature processing. (Polycrystalline silicon is silicon having grain sizes larger than about 0.1 μm).

Not only is the choice of filler material of extreme importance, but the choice of trench configuration is equally important because all configurations are not useful. For example, if the polysilicon deposited into the trench is to be essentially free of voids, which often lead to cracks, then three conditions should be met, two of which involve the trench configuration. The first of these conditions is that the average angle between the trench sidewall (which includes portions having different slopes) and a perpendicular drawn to the original substrate surface at the intersection of the sidewall and substrate surface, is greater than or equal to about 5 degrees. (For the right half of the sidewall (as viewed in FIG. 3) the angle is measured in the clockwise direction from the portion of the above perpendicular extending above the substrate surface, while for the left half of the sidewall, the angle is measured in the counterclockwise direction, also from the portion of the above perpendicular extending above the substrate surface.) The second condition is that the angle between a tangent drawn to any point of the sidewall and the above perpendicular is greater than, or equal to, zero degrees. The third condition is that the thickness of the deposited polysilicon is greater than half the width of the trench.

BRIEF DESCRIPTION OF THE DRAWING

The invention is described with reference to the accompanying drawings, wherein.

DETAILED DESCRIPTION

The invention involves a new CMOS device which eliminates, or significantly reduces the possibility of, latchup while achieving a spacing between the n-channel and p-channel FETs of the device less than 10 μm, preferably less than 4 μm, and even as small as the resolution limit of the lithographic technique used to fabricate the device. (In the case of, for example, present day commercial photolithography, this resolution limit is about 1 μm.) The invention also involves a method for fabricating the inventive device.

The inventive CMOS device, unlike prior devices, includes a polysilicon-filled, latchup-preventing trench in the substrate between the p-channel and n-channel FETs of the device. Because latchup-inducing charge carriers must necessarily flow around the trench rather than through the trench, the path length of the charge carriers is increased, and thus the Base Gummel Number of the horizontal parasitic bipolar transistor inherent in the device is increased with no increase in spacing between the FETs.

Figure 1:
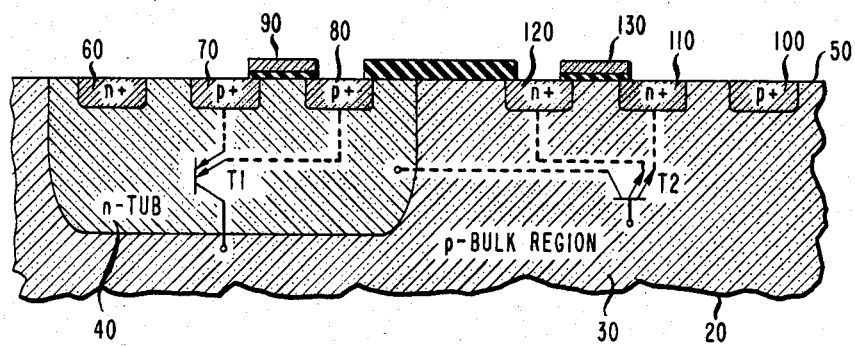
FIG. 1 is a cross-sectional view of a conventional CMOS device.
Figure 2:
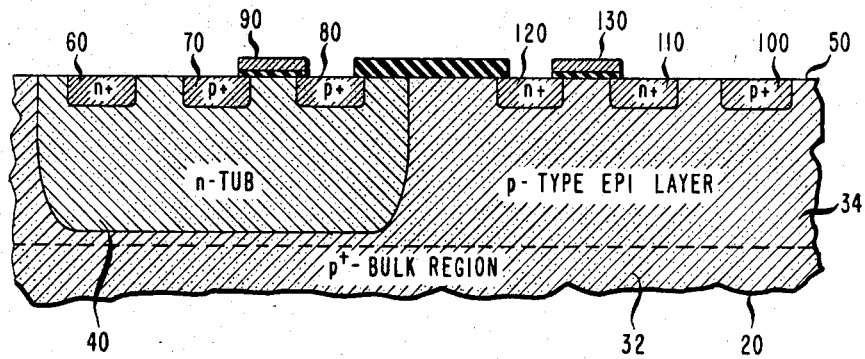
FIG. 2 is a cross-sectional view of a CMOS device which includes a relatively heavily doped bulk region for shunting latchup-inducing currents.
Figure 3:
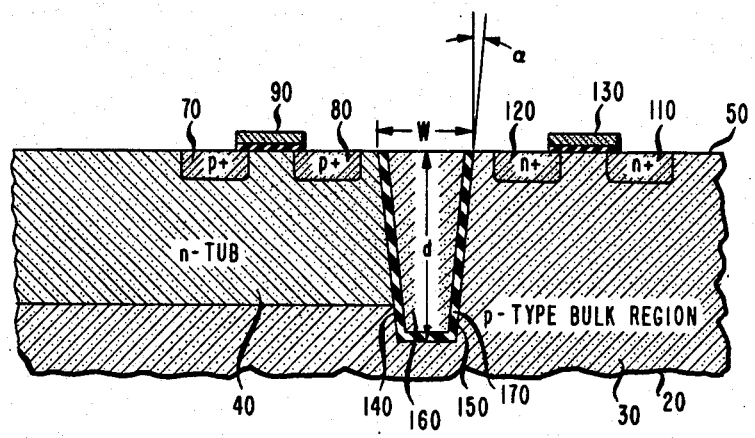
FIG. 3 is a cross-sectional view of a first embodiment of the inventive CMOS device.

A first embodiment of the inventive CMOS device, depicted in FIG. 3, like the conventional CMOS device shown in FIG. 1, includes a substrate 20, preferably of silicon, having a bulk region 30 of, for example, p-type conductivity (n-type conductivity is also useful). The bulk region 30 extends downwardly (as viewed in FIG. 3) from a major surface 50 of the substrate 20, and has a doping level ranging from about $10^{15}$ cm$^{-3}$ to about $10^{17}$ cm$^{-3}$. Doping levels less than about $10^{15}$ cm$^{-3}$ are undesirable because they require undesirably deep trenches to significantly reduce the possibility of latchup. Doping levels greater than about $10^{17}$ cm$^{-3}$ are undesirable because they result in undesirably larger junction capacitances associated with the FET or FETs formed in the bulk region 30.

The substrate 20 of the inventive CMOS device also includes a tub 40 of conductivity type opposite to that of the bulk region 30, e.g., n-type conductivity, also xtending from the surface 50. The tub 40 is formed by implanting (and then diffusing) an opposite conductivity dopant into the bulk region 30, using conventional implantation techniques. The depth of the tub 40 is preferably greater than about ½ μm, while the vertical integrated doping level of the tub 40, i.e., the integral of the doping level of the tub 40 over the depth of the tub 40, ranges from about $10^{12}$ to about $10^{15}$ cm$^{-2}$, and is preferably about $10^{13}$ cm$^{-2}$. A depth less than about ½ μm, and/or a vertical integrated doping level less than about $10^{12}$ cm$^{-2}$, often result in undesirable punch-through from the source (of an FET formed in the tub 40) to the bulk region 30. A vertical integrated doping level greater than about $10^{15}$ cm$^{-2}$ results in undesirably large capacitances, e.g., undesirably large source-to-tub and drain-to-tub capacitances, associated with the FET or FETs formed in the tub 40.

Unlike previous devices, the inventive CMOS device includes a trench 140 which prevents, or substantially reduces the possibility of, latchup. The trench is formed in the silicon substrate 20, and separates the one or more p-channel FETs formed in the tub 40 from the one or more n-channel FETs fabricated in the bulk region 30, i.e., the trench encircles the FETs in the tub 40. Preferably, the trench 140 is formed after the fabrication of the tub 40 but before the fabrication of the FETs, and is preferably positioned at the juncture of the tub 40 and bulk region 30.

While the trench 140 prevents (or substantially reduces the possibility of) latchup, it is desirable to fill the trench to avoid non-planar substrate surfaces, with their attendant device fabrication difficulties. However, to satisfy this desire and yet avoid cracks which unexpectedly develop during the high temperature processing involved in fabricating the inventive device, the trench is filled with a material 160 (see FIG. 3) whose coefficient of thermal expansion is not substantially different from that of the silicon substrate, i.e., the ratio of the thermal expansion coefficient of the filler material to that of silicon is less than about 3. A preferred filler material 160 which meets this requirement is polysilicon which is readily deposited into the trench 140 using, for example, conventional chemical vapor deposition (CVD) techniques. Filler materials which do not meet the above requirement, such as SiO$_2$, are undesirable because they result in the formation of cracks and dislocations at the filler-substrate interface ,uring high temperature processing. (The high temperature processing includes, for example, the high temperature diffusion processes involved in fabricating the sources and drains of the FETs.) Preferably the deposited polysilicon has a doping level less than about $10^{15}$ cm$^{-3}$, and more preferably the polysilicon is undoped. Doping levels greater than about $10^{15}$ cm$^{-3}$ are undesirable because they reduce the threshold voltage for inverting the silicon adjacent the trench sidewall 150 (see FIG. 3) to an undesirably low level.

Additionally, to avoid cracks and/or voids in the polysilicon, three further conditions should be met. The first of these conditions is that the angle (denoted $\alpha$ in FIG. 3) between the trench sidewall 150 and a perpendicular drawn to the original substrate surface 50 at the intersection of the sidewall 150 and original substrate source 50 is equal to, or greater than, about +5 degrees. For purposes of the invention, the angle $\alpha$ is defined as the average angle between the tangents drawn to each point of the sidewall 150 and the above perpendicular. (For the right side of the trench sidewall, as viewed in FIG. 3, the angle between a tangent and the above perpendicular is positive when measured in the clockwise direction from the portion of the perpendicular extending above the original substrate surface 50, while for the left side of the trench sidewall, the angle between a tangent and the perpendicular is positive when measured in the counterclockwise direction from the portion of the perpendicular extending above the original substrate surface 50.) The second condition is that the angle formed between a tangent drawn to any point of the sidewall and the above perpendicular is greater than, or equal to, zero degrees. The third condition is that the thickness of the polysilicon deposited onto the substrate surface 50, and thus into the trench 140, is greater than half the width of the trench.

While the first of the above three conditions only requires the angle $\alpha$ to be equal to, or greater than, about +5 degrees, $\alpha$ is preferably no greater than about +10 degrees. Angles greater than about +10 degrees, while not precluded, are less desirable because they result in undesirably large trench widths (each degree in excess of 10 degrees adds about 0.3 $\mu$m to the width of a 10 $\mu$m deep trench).

The depth, d, of the trench 140 (defined as the average length of the lines perpendicular to, and extending from, imaginary planes covering the top of the trench to the lowest point of the trench, the planes being tangent to each point of the substrate surface 50 external to, and immediately adjacent, the outer periphery of the trench) ranges from about 2 $\mu$m (corresponding to a doping level of the bulk region 30 equal to about $10^{17}$ cm$^{-3}$) to about 30 $\mu$m (corresponding to a doping level of the bulk region 30 equal to about $10^{15}$ cm$^{-3}$). A trench depth less than about 2 $\mu$m is undesirable because this produces an undesirably low Gummel Number for the bulk region 30, and thus does not significantly reduce the possibility of latchup, while a trench depth greater than about 30 $\mu$m, while not precluded, requires an undesirably long fabrication time.

The trench width, w (the avrage of the shortest distances from each point on the outer periphery, to the inner periphery, of the top of the trench), is less than 10 $\mu$m, preferably less than about 4 $\mu$m, and even as small as the resolution limit of the lithographic technique used in fabricating the inventive CMOS device. A corresponding spacing between the p-channel and n-channel FETs of the device is achieved provided these FETs are fabricated with their right and left sides (as viewed in FIG. 3), respectively, abutting the trench.

To prevent conduction of latchup-inducing currents, and diffusion of dopant, from the substrate 20 into the polysilicon 160, the trench 140 preferably includes a relatively thin layer of dielectric material (material whose bandgap is greater than about 2 eV) 170 covering the interior surface of the trench, i.e., covering both the sidewall 150 (see FIG. 3) and the bottom of the trench. Useful dielectric materials include $SiO_2$ and $Si_3N_4$. An $SiO_2$ layer 170 is formed on the interior surface of the trench by, for example, thermally oxidizing the silicon immediately adjacent the trench interior surface. On the other hand, a $Si_3N_4$ layer 170 is deposited onto the interior trench surface by conventional CVD techniques. The thickness of the dielectric layer 170 (if employed) ranges from about 200 Angstroms (Å) to about 5000 Å. A thickness less than about 200 Å is undesirable because so thin a layer is ineffective to prevent short circuits through the polysilicon. A thickness greater than about 5000 Å is undesirable because so thick a layer of, for example, thermally grown $SiO_2$, results in the formation of cracks and dislocations at the $SiO_2$-Si interface during high temperature processing.

Figure 4:
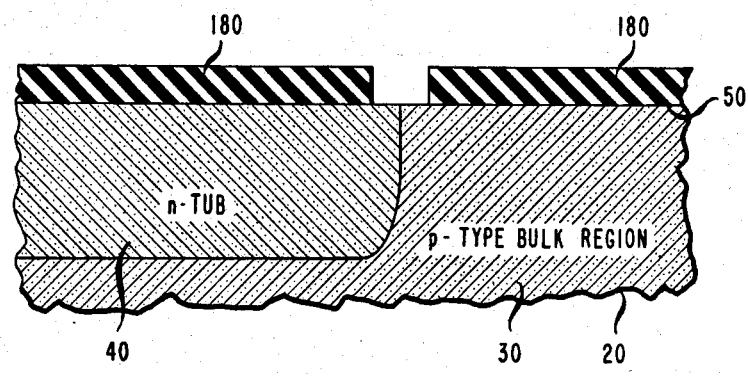
FIG. 4 depicts a process for fabricating the device of FIG. 3.

A trench 140 having the above width, depth, and sidewall limitations is readily formed in a silicon substrate 20, in accordance with the inventive fabrication method, by reactive ion etching (RIE) the substrate through a (patterned) masking layer 180 (see FIG. 4). The masking layer 180 covers the whole of the substrate surface 50 except for the area into which the trench 140 is to be etched (and, if desired, those regions not susceptible to etching, e.g., metallized regions). The masking layer 180 is, for example, of $SiO_2$ or $Si_3N_4$ and is formed either by selectively oxidizing the substrate surface 50 (to form a masking layer of $SiO_2$) and/or by depositing the masking layer onto the surface 50 using conventional deposition techniques, e.g., conventional CVD techniques. The masking layer is patterned using conventional lithographic techniques, and thus the opening in the masking layer (and therefore the width of the trench 140) is, for example, as small as the resolution limit of these lithographic techniques.

The thickness of the masking layer 180 depends on the selectivity (the ratio of the etch rate of one material to that of another material) between Si and the masking material of the etchant used to etch the trench 140, as well as the depth of the trench. Because the selectivities of the etchant gases useful in the RIE technique range from about 2-to-1 to about 30-to-1, and because the trench depth ranges from about 2 $\mu$m to about 30 $\mu$m, the thickness of the masking layer ranges from about 0.1 $\mu$m to about 15 $\mu$m. A thickness less than about 0.1 $\mu$m is undesirable because the masking layer 180 will be etched away (for suitable etchants) before the full trench depth has been etched. A thickness greater than about 15 $\mu$m, although not precluded, is less than about 15 $\mu$m, although not precluded, is less desirable because it requires an undesirably long time to pattern, i.e., etch, the masking layer.

After the formation of the patterned masking layer 180 on the substrate surface 50, the substrate 20 is mounted on the driven electrode of an RIE machine, into which an etchant gas is introduced. A variety of etchant gases are available including, for example, a mixture of $Cl_2$ and Ar, $CCl_3F$ (Freon 11), and $SF_6$. In the case of, for example, a mixture of $Cl_2$ and Ar, the mixture includes about 3 percent to about 20 percent (by volume) $Cl_2$. Percentages less than about 3 percent are undesirable because they produce undesirably low etch rates (lower than about 100 Å per minute). Percentages greater than about 20 percent are undesirable because they result in the sidewall angle, $\alpha$, being less than about 5 degrees.

The etchant mixture is introduced into the RIE etching chamber at a flow rate sufficient to achieve a pressure within the chamber ranging from about 10 millitorr to about 100 millitorr. Pressures less than about 10 millitorr are less desirable because they produce low etch rates, while pressures greater than about 100 millitorr result in sidewall angles, $\alpha$, greater than about 10 degrees.

A plasma is produced in the gaseous atmosphere within the etching chamber, and thus etching is initiated, when radio frequency power is applied between the driven and grounded electrodes of the RIE machine. Preferably, the DC bias (voltage) on the driven electrode (relative to ground) ranges from about $-100$ volts to about $-400$ volts. DC biases having magnitudes less than about 100 volts, while not precluded, are less desirable because they result in low etch rates, while DC biases having magnitudes greater than about 400 volts are undesirable because they often produce an undesirably large amount of sputtering (as opposed to chemical etching), which results in the deposition of an undesirably large amount of debris on the sidewall 150 of the trench.

After the formation of the trench 140, the masking layer 180 is removed (using conventional etchants) and, if desired, the relatively thin layer of dielectric material 170 (see FIG. 3) is formed on the interior surface of the trench, and a layer of polysilicon is deposited onto the substrate surface 50, and thus into the trench 140. The unwanted polysilicon covering the substrate surface external to the trench and overlying the top of the trench, is then removed by etching back the polysilicon to the original substrate surface 50 by, for example, plasma etching the polysilicon in an atmosphere of $CF_4$ and 8 percent (by volume) $O_2$.

In the event of insufficient deposition, the filler material, e.g., polysilicon, covering the surface 50 and overlying the top of the trench, often presents a non-planar surface which, while not precluded, is generally undesirable during processing. Such a non-planar surface includes, for example, a depression in the filler material covering the top of the trench. If, during etch back, the polysilicon is etched with an isotropic etchant (an etchant which etches both vertically and laterally) the presence of the depression will result in the lateral etching of some material within the trench. But lateral etching of filler material within the trench often results in portions of the trench sidewall 150 becoming uncovered. Such a result is undesirable because the silicon adjacent an uncovered sidewall portion is susceptible to inversion by signal leads on the surface of the CMOS device.

It has been found that the deposited filler material presents a substantially planar surface, and thus the possibility of laterally etching filler material within the trench is avoided, provided the thickness of the deposited filler material is greater than about 1.5 w (where w is the width of the trench).

Nonuniform etching (during etch back) of the filler material, as well as intentional overetching of the filler material (because of variations in the thickness of the deposited filler material), often also result in the etching of filler material within the trench. Thus, in an alternative fabrication procedure, the masking layer 180 is not removed prior to the deposition step, and filler material is deposited onto the masking layer (and thus into the trench 140). During etch back, the masking layer serves as an etch stop. Therefore, after removal of the masking layer, the plug of filler material within the trench extends above the top of the trench (to a maximum height equal to the height of the masking layer) creating an extension of filler material protruding from the trench, over the original substrate surface 50. This extension provides excess filler material whose presence (during overetching) prevents the removal of filler material from within the trench. The extension also shields the sidewall 150 from conductive leads traversing the surface of the CMOS device, which are capable of inverting the silicon underlying the sidewall. The masking layer 180 is then removed.

After the etch back step, a field oxide (not shown) is formed (to separate, and laterally electrically isolate, the FETs of the inventive CMOS device) by selectively oxidizing the surface of the substrate 20. Finally, one or more p-channel FETs is formed in the n-tub 40, and one or more n-channel FETs is formed in the bulk region 30, adjacent the surface 50, by conventional techniques.

Figure 5:
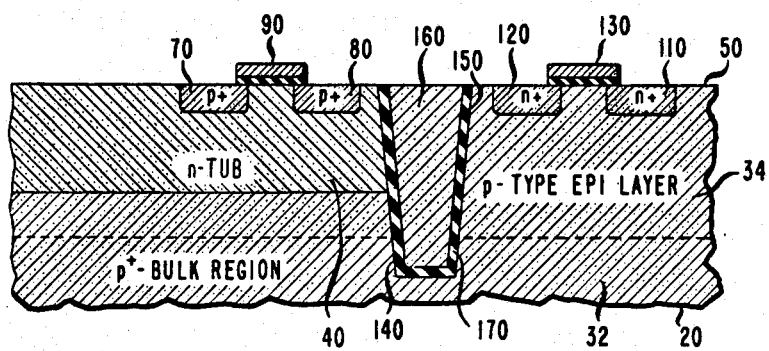
FIGS. 5–6 are cross-sectional views of second and third embodiments of the inventive CMOS device.

With reference to FIG. 5, a second embodiment of the inventive CMOS device differs from the first embodiment in that the substrate 20 includes a relatively heavily doped bulk region 32 of, for example, p-type conductivity, supporting a moderately doped, relatively thin (compared to the bulk region 32) layer 34 whose conductivity type is the same as that of the region 32. The layer 34 is preferably epitaxially grown on the bulk region 32 using, for example, conventional vapor phase epitaxy. A tub 40 of, for example, n-type conductivity, is formed in the moderately doped layer 34 and a trench 140 extends through the thickness of the layer 34 at least to the heavily doped bulk region 32. The advantage of this arrangement is that the depth of the trench 140 is reduced (as compared to the trench employed in the first embodiment) because the heavy doping within the bulk region 32 increases the Gummel Number of the base (which includes a portion of the moderately doped layer 34 and a portion of the relatively heavily doped bulk region 32) of the horizontal bipolar transistor inherent in the device. In addition, the collector current of the parasitic vertical bipolar transistor T1 is shunted into the bulk region 32.

The doping level within the bulk region 32 ranges from about $10^{17}$ to about $10^{21}$ cm$^{-3}$, and is preferably about $10^{20}$ cm$^{-3}$. A doping level less than about $10^{17}$ cm$^{-3}$ is undesirable because so low a doping level yields an undesirably low Gummel Number, and thus does not significantly reduce the possibility of latchup. A doping level greater than about $10^{21}$ cm$^{-3}$ is undesirable because so high a doping level results in an undesirably large out-diffusion of dopant from the bulk region 32 into the layer 34.

The layer 34 has a thickness ranging from about 1 $\mu$m to about 10 $\mu$m, and a doping level ranging from about $10^{14}$ to about $10^{17}$ cm$^{-3}$. Thicknesses less than about 1 $\mu$m are undesirable because they result in punchthrough from the sources of the FETs formed in the layer 34 to the bulk region 32. Thicknesses greater than about 10 $\mu$m are undesirable because they require undesirably long times to etch when forming the trench 140. Doping levels less than about $10^{14}$ cm$^{-3}$ are undesirable because they result in punchthrough between the source of one transistor and the drain of an adjacent transistor formed in the layer 34. Doping levels greater than about $10^{17}$ cm$^{-3}$ are undesirable because they result in undesirably large junction capacitances associated with the FETs formed in the layer 34.

The tub 40 has a thickness greater than about $\frac{1}{2}$ $\mu$m but less than the thickness of the layer 34, and a vertical integrated doping level ranging from about $10^{12}$ to about $10^{15}$ cm$^{-2}$. Thicknesses less than about ½ μm and vertical integrated doping levels outside the specified range are undesirable for reasons given above.

The reduced trench depth (the trench only extends through the thickness of the layer 34 into the bulk region 32), implies that the corresponding thickness of the masking layer 180 (see FIG. 4) ranges from about 0.1 μm to about 4 μm. Thicknesses outside the specified range are undesirable for the reasons given above.

Figure 6:
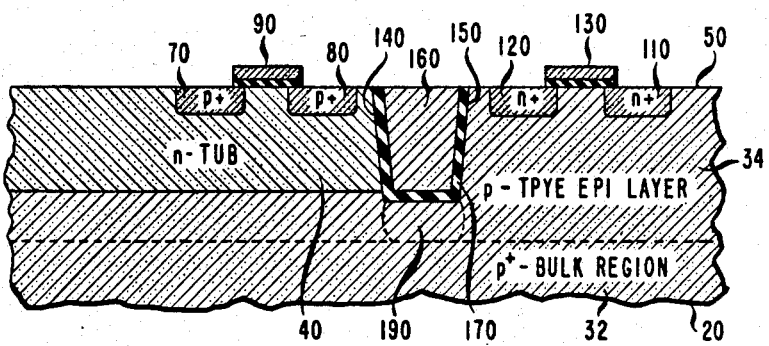

With reference to FIG. 6, a third embodiment of the inventive CMOS device is generally similar to the second embodiment except that the depth of the trench 140 is reduced by the depth of a relatively heavily doped region 190 within the layer 34, extending from the bottom of the trench into the bulk region 32. The conductivity type and the doping level range for the region 190 is the same as that for the bulk region 32, and thus the region 190 is essentially an extension of the bulk region 32 into the layer 34. The region 190 serves the same purpose as the bulk region 32, i.e., it increases Base Gummel Number (while decreasing trench depth).

The region 190 is formed by implanting donor or acceptor ions (depending on whether the region 190 is to be of n+- or p+-type conductivity) into the semiconductor material adjacent the bottom of the trench, and then diffusing these ions toward the bulk region 32 with a heat treatment. Because ions diffuse both vertically and laterally, vertical diffusion, and thus the depth of region 190, is preferably less than about 4 μm to avoid undesirable lateral diffusion of dopant into the tub 40.

Ion implantation preferably occurs after the formation of the dielectric layer 170 on the walls of the trench 140 (and before the deposition of the polysilicon). Because the trench sidewall 150 is inclined to the vertical (as viewed in FIG. 6), and because the ions travel an essentially vertical path, the ions impinging the sidewall of the trench must penetrate a greater thickness of dielectric material than the ions impinging the bottom of the trench to reach the underlying semiconductor material. Thus, relatively few, if any, ions penetrate the sidewall 150 into the tub 40.

If, for example, acceptor ions, such as boron ions, are used to dope the region 190, then useful dopant implantation levels (dopant per unit area) range from about $10^{14}$ to about $10^{17}$ cm$^{-2}$. An implantation level less than about $10^{14}$ cm$^{-2}$ is undesirable because this results in an undesirably low dopant concentration (dopant per unit volume) in the region 190. An implantation level greater than about $10^{17}$ cm$^{-2}$ is undesirable because so great an implantation level is more than is required to achieve the desired dopant concentration, and requires an undesirably long time to achieve.

Useful boron implantation energies range from about 5 keV to about 2000 keV. Energies less than about 5 keV are undesirable because they are too low to enable the ions to penetrate the dielectric layer 170 (at the bottom of the trench 140). Energies greater than about 2000 keV are undesirable because they require undesirably thick masking layers to shield the portions of the substrate surface not to be implanted. Moreover, they result in so deep an implant that undesirably few ions diffuse to the bottom of the trench during the subsequent heat treatment.

In order to diffuse the implanted boron ions throughout the region 190, the substrate 20 is subjected to heating. Useful temperatures and heating times range from about 900 degrees C. for about one hour, to about 1100 degrees for about 9 hours. Temperatures and heating times less than about 900 degrees and less than about 1 hour are undesirable because they lead to undesirably little diffusion. Temperatures and heating times greater than about 1100 degrees and greater than about 9 hours are undesirable because the ions diffuse undesirably far into the tub 40.

An alternative procedure to the one described above involves implanting and diffusing the boron ions after the formation of the trench 140 but before the formation of the dielectric layer 170. This alternative procedure differs from the above procedure only in that the lower end of the boron implantation energy range is about 2 keV. Energies less than about 2 keV are undesirable because undesirably few ions penetrate the bottom of the trench to reach the underlying silicon.

What is claimed is:
1. A device, comprising:
a semiconductor substrate which includes first and second regions extending from a surface of said substrate, the conductivity type of the second region being opposite to that of the first region; and
said first and second regions including, respectively, first and second field effect transistors, the channel conductivity type of said first transistor and of said second transistor being opposite, respectively, to the conductivity type of said first region and of said second region,
characterized in that
said device further comprises a trench containing a composition comprising polysilicon, extending from said surface into said substrate between said first and second transistors, said trench including a sidewall which, in cross-section, is substantially linear and forms an angle with a perpendicular drawn to said surface at the intersection of said sidewall and said surface which ranges from about 5 degrees to about 10 degrees.

2. The device of claim 1 wherein said semiconductor substrate is of silicon.

3. The device of claim 1 wherein a width of said trench is less than about 10 μm.

4. The device of claim 1 wherein a width of said trench is less than about 4 μm.

5. The device of claim 1 wherein a depth of said trench ranges from about 2 μm to about 30 μm.

6. The device of claim 1 wherein a doping level of said first region ranges from about $10^{15}$ cm$^{-3}$ to about $10^{17}$ cm$^{-3}$.

7. The device of claim 1 wherein an integrated doping level of said second region ranges from about $10^{12}$ cm$^{-2}$ to about $10^{15}$ cm$^{-2}$.

8. The device of claim 1 further comprising a layer of dielectric material covering an interior surface of said trench.

9. The device of claim 1, wherein:
said first region includes a bulk region supporting a relatively thin layer containing said second region, the interface between said bulk region and said relatively thin layer being substantially planar, and the conductivity type of said thin layer, external to said second region, being the same as that of the bulk region, the doping level of said thin layer being less than that of said bulk region; and
said trench extends through the thickness of said layer at least to said bulk region.

10. The device of claim 9 wherein a doping level of said layer ranges from about $10^{14}$ cm$^{-3}$ to about $10^{17}$ cm$^{-3}$ and a doping level of said bulk region ranges from about $10^{17}$ cm$^{-3}$ to about $10^{21}$ cm$^{-3}$.

11. The device of claim 9 wherein a thickness of said layer ranges from about 1 μm to about 10 μm.

12. The device of claim 9 wherein said layer is epitaxially grown on said bulk region.

* * * * *